United States Patent
Takeda

(10) Patent No.: US 11,543,293 B2
(45) Date of Patent: Jan. 3, 2023

(54) PHOTODETECTOR

(71) Applicant: Nippon Telegraph and Telephone Corporation, Tokyo (JP)

(72) Inventor: Kotaro Takeda, Musashino (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 0 days.

(21) Appl. No.: 17/422,022

(22) PCT Filed: Jan. 15, 2020

(86) PCT No.: PCT/JP2020/000954
§ 371 (c)(1),
(2) Date: Jul. 9, 2021

(87) PCT Pub. No.: WO2020/149276
PCT Pub. Date: Jul. 23, 2020

(65) Prior Publication Data
US 2022/0099486 A1 Mar. 31, 2022

(30) Foreign Application Priority Data
Jan. 16, 2019 (JP) .............................. JP2019-005493

(51) Int. Cl.
*G01J 1/44* (2006.01)
*H01L 31/0232* (2014.01)
(Continued)

(52) U.S. Cl.
CPC ............ *G01J 1/44* (2013.01); *G01J 2001/446* (2013.01); *H01L 31/02327* (2013.01); *H01L 31/105* (2013.01); *H01L 31/109* (2013.01)

(58) Field of Classification Search
CPC . G01J 1/44; G01J 2001/446; H01L 31/02327; H01L 31/105; H01L 31/109
See application file for complete search history.

(56) References Cited

U.S. PATENT DOCUMENTS

2007/0046947 A1* 3/2007 Lo .................... G01R 31/307
356/492
2009/0238582 A1 9/2009 Tsunoda et al.
(Continued)

FOREIGN PATENT DOCUMENTS

JP H04-192378 7/1992
JP H11-135822 A 5/1999
(Continued)

OTHER PUBLICATIONS

T. Yin, R. Cohen, M. M. Morse, G. Sarid, Y. Chetrit, D. Rubin, and M. J. Paniccia, "31 GHz Ge n-i-p waveguide photodetectors on silicon-on-insulator substrate," Opt. Express 15(21), 13965-13971 (Year: 2007).*
(Continued)

*Primary Examiner* — Thanh Luu
*Assistant Examiner* — Monica T Taba
(74) *Attorney, Agent, or Firm* — Workman Nydegger

(57) ABSTRACT

A GePD having uniform sensitivity in C and L bands is provided and a photodetector in which deterioration of a common-mode rejection ratio is curbed is provided. A photodetector according to an embodiment includes one or a plurality of sets of two photodiodes to which a differential signal is input, a monitor connected to each of the two photodiodes and configured to measure a photocurrent, and a voltage supply configured to control a voltage applied to each of the two photodiodes, and the voltage supply controls the voltage applied to each of the two photodiodes so that the photocurrent measured by the monitor connected to one of the two photodiodes is equal to the photocurrent measured by the monitor connected to another one of the two photodiodes.

7 Claims, 12 Drawing Sheets

(51) Int. Cl.
*H01L 31/105* (2006.01)
*H01L 31/109* (2006.01)

(56) References Cited

U.S. PATENT DOCUMENTS

| | | | | |
|---|---|---|---|---|
| 2010/0316386 | A1* | 12/2010 | Luk | H04B 10/2587 |
| | | | | 398/93 |
| 2015/0108327 | A1* | 4/2015 | Huang | H01L 31/03529 |
| | | | | 257/438 |
| 2016/0109667 | A1* | 4/2016 | Cornelius | G02B 6/4286 |
| | | | | 356/73.1 |
| 2016/0155863 | A1* | 6/2016 | Baehr-Jones | H01L 27/14649 |
| | | | | 438/69 |
| 2016/0313551 | A1* | 10/2016 | Takei | A61B 1/005 |

FOREIGN PATENT DOCUMENTS

| | | |
|---|---|---|
| JP | 2015-153899 A | 8/2015 |
| JP | 2018-195654 A | 1/2018 |
| WO | 2008/099507 A1 | 8/2008 |

OTHER PUBLICATIONS

A. Novack, M. Gould, Y. Yang, Z. Xuan, M. Streshinsky, Y. Liu, G. Capellini, A. E.-J. Lim, G.-Q. Lo, T. Baehr-Jones, and M. Hochberg, "Germanium photodetector with 60 GHz bandwidth using inductive gain peaking," Opt. Express 21(23), 28387-28393 (Year: 2013).*

G. G. Macfarlane et al., *Fine Structure in the Absorption-Edge Spectrum of Ge*, Physical Review, vol. 108, No. 6, 1957, pp. 1377-1383.

* cited by examiner

PHOTODETECTOR

TECHNICAL FIELD

The present invention relates to a photodetector, and more particularly to a photodetector that is used in an optical communication system, an optical information processing system, or the like and has a small common-mode rejection ratio when a differential signal is received.

BACKGROUND ART

With the spread of optical communication in recent years, there is a demand for cost reduction of optical communication devices. As one of solutions thereto, a method of forming an optical circuit constituting an optical communication device on a silicon wafer having a large diameter using a micro optical circuit technique based on silicon photonics is known. Thus, a material cost per chip can be dramatically reduced, and a cost of the optical communication device can be reduced. A photodetector formed on a silicon (Si) substrate using such a technique includes a germanium photodiode (GePD) capable of monolithic integration.

FIG. 1 illustrates a structure of a waveguide-coupled vertical GePD of the related art. FIG. 2 is a cross-sectional view taken along a reference sign II-II of FIG. 1. A vertical GePD 100 is formed on a silicon on insulator (SOI) substrate including a Si substrate, a Si oxide film, and a surface Si layer using a lithography technique or the like. The vertical GePD 100 includes a Si substrate 101, a lower clad layer 102 formed of a Si oxide film on the Si substrate, a core layer 110 that guides signal light, a Ge layer 114 that absorbs light formed on the core layer 110, and an upper clad layer 103 formed on the core layer 110 and the Ge layer 114. The core layer 110 is divided into a waveguide layer 141 and a silicon slab 142.

In the silicon slab 142, a p-type Si slab 111 doped with impurity ions having a first conductivity type and silicon electrode portions 112 and 113 doped with impurity ions having a first conductivity type at a high concentration and acting as electrodes are formed. The Ge layer 114 is stacked by epitaxial growth, and a Ge region 115 doped with impurity ions having a second conductivity type is formed on the Ge layer 114. The Ge layer 114 may be of a germanium compound. Electrodes 116 to 118 are included on the silicon electrode portions 112 and 113 and the Ge region 115, respectively, to come into contact with the silicon electrode portions 112 and 113 and the Ge region 115.

In order to make a structure easy to understand, the clad layer 103 is omitted and only positions at which the electrodes 116 to 118 come into contact with the silicon electrode portions 112 and 113 and the Ge region 115 are shown in FIG. 1.

In the vertical GePD 100, when light is incident on the silicon slab 142 from the waveguide layer 141 and is absorbed by the Ge layer 114, a photocurrent flows between an electrode 117 and the electrodes 116 and 118. The light is detected by detecting this photocurrent.

FIG. 3 illustrates a first example of a waveguide-coupled horizontal GePD of the related art. The horizontal GePD 100 includes a germanium region 121 doped with impurity ions having a first conductivity type and a germanium region 122 doped with impurity ions having a second conductivity type, instead of the p-type Si slab 111 and the Ge region 115 illustrated in FIG. 2.

FIG. 4 illustrates a second example of a waveguide-coupled horizontal GePD of the related art. The horizontal GePD 100 includes a silicon region 131 doped with impurity ions having a first conductivity type, a silicon region 132 doped with impurity ions having a second conductivity type, and a silicon electrode portion 133 doped with second impurities at a high concentration and acting as an electrode, instead of the p-type Si slab 111 and the Ge region 115 illustrated in FIG. 2.

FIG. 5 illustrates temperature and wavelength dependent characteristics of sensitivity of a GePD of the related art. The GePD of the related art has characteristics that temperature characteristics of sensitivity are not constant. Here, the sensitivity is a characteristic of a current output with respect to optical input power, and has units of A/W. FIG. 5 is a diagram obtained by plotting sensitivity to temperature in a C band and an L band (wavelengths 1530 to 1565 nm and 1565 to 1625 nm, respectively) of a communication wavelength band when a reverse bias of 1.6 V is applied to a GePD. For example, the sensitivity at 31° C. is substantially constant up to the vicinity of the C band, but the sensitivity decreases in the L band. This change in sensitivity is caused by a change in a light absorption spectrum of germanium. At −5° C., the sensitivity tends to decrease even in the C band.

FIG. 6 illustrates temperature dependent characteristics of the light absorption spectrum of Ge. A horizontal axis indicates photon energy, and a vertical axis indicates a square root of an absorption coefficient (see, for example, Non Patent Literature 1). When a temperature becomes low, a bandgap of the germanium shifts to the high energy side. That is, an edge of the light absorption spectrum shifts to a short wavelength side. The edge of the light absorption spectrum of germanium that is used for a GePD is just around 1565 nm on the long wavelength side of the C band at 31° C. Therefore, even when a GePD shows constant sensitivity over the entire C band at 31° C., the sensitivity gradually decreases from the long wavelength side as the temperature decreases. This tendency is illustrated in FIG. 5 and the sensitivity tends to decrease at −5° C., which is a low temperature, when the wavelength becomes longer.

In order to incorporate a GePD the sensitivity of which changes depending on the temperature and the wavelength into an optical communication system, a circuit that compensates for change in sensitivity is required, which increases a manufacturing cost. A means for solving this includes a means for controlling a voltage that is applied to a GePD according to the temperature and the wavelength (see, for example, Patent Literature 1).

On the other hand, in a photodetector in an optical communication system or an optical information processing system, using GePDs, a single GePD is rarely used and about 2 to 8 GePDs are generally used side by side. This is because a system adopting a wavelength division multiplexing (WDM) scheme using multiple wavelengths requires as many GePDs as the number of wavelengths, and a system adopting an optical digital coherent communication technology uses as a balanced PD.

FIG. 7 illustrates an example of a configuration of a receiver that is used in the optical digital coherent communication technology. The receiver is a dual-polarization multiplex quadrature phase shift keying (DP-QPSK) receiver, and received light is separated into two orthogonal polarized waves by a polarized wave separator 11. In optical hybrids 13a and 13b, the two polarized waves are caused to interfere with local light from a local light emitting source 12, intensity and phase information is detected, and two sets of differential signals are converted to electrical signals by four GePDs 14 and 15. In such a receiver, when temperature control is performed, it is necessary for a heater to be included in each of the GePDs 14 and 15. In particular, because the GePDs connected to the same optical hybrid receive differential signals in pairs, the paired GePDs are required to have uniform sensitivity.

CITATION LIST

Patent Literature

Patent Literature 1: JP 2015-153899 A

Non Patent Literature

Non Patent Literature 1: Macfarlane G. G., T. P. McLean, J. E. Quarrington and V. Roberts, "fine Structure in the Absorption-Edge Spectrum of Ge," Physical Review vol. 108, No. 6 (1957) p. 1377-1383.

SUMMARY OF THE INVENTION

Technical Problem

In a photodetector, when sensitivity of a set of GePD groups that receive a differential signal is not uniform, a common-mode rejection ratio deteriorates and the performance of a receiver deteriorates. However, GePDs have manufacturing variation, and this variation may cause a specification of the common-mode rejection ratio not to be satisfied in a receiver.

Means for Solving the Problem

An object of the present invention is to provide a GePD having uniform sensitivity in C and L bands and to provide a photodetector in which deterioration of a common-mode rejection ratio has been curbed.

In order to achieve such an object, a photodetector according to an embodiment of the present invention includes one or a plurality of sets of two photodiodes to which a differential signal is input, a monitor connected to each of the two photodiodes and configured to measure a photocurrent, and a voltage supply configured to control a voltage applied to each of the two photodiodes, in which the voltage supply controls the voltage applied to each of the two photodiodes so that the photocurrent measured by the monitor connected to one of the two photodiodes is equal to the photocurrent measured by the monitor connected to another one of the two photodiodes.

Effects of the Invention

According to the present invention, because voltages that are applied to the photodiodes can be adjusted so that current values of the monitors are equal to each other and the sensitivity of the two photodiodes can be made uniform, it is possible to curb deterioration of a common-mode rejection ratio.

DESCRIPTION OF EMBODIMENTS

Hereinafter, embodiments of the present invention will be described in detail with reference to the drawings.

Figure 8:
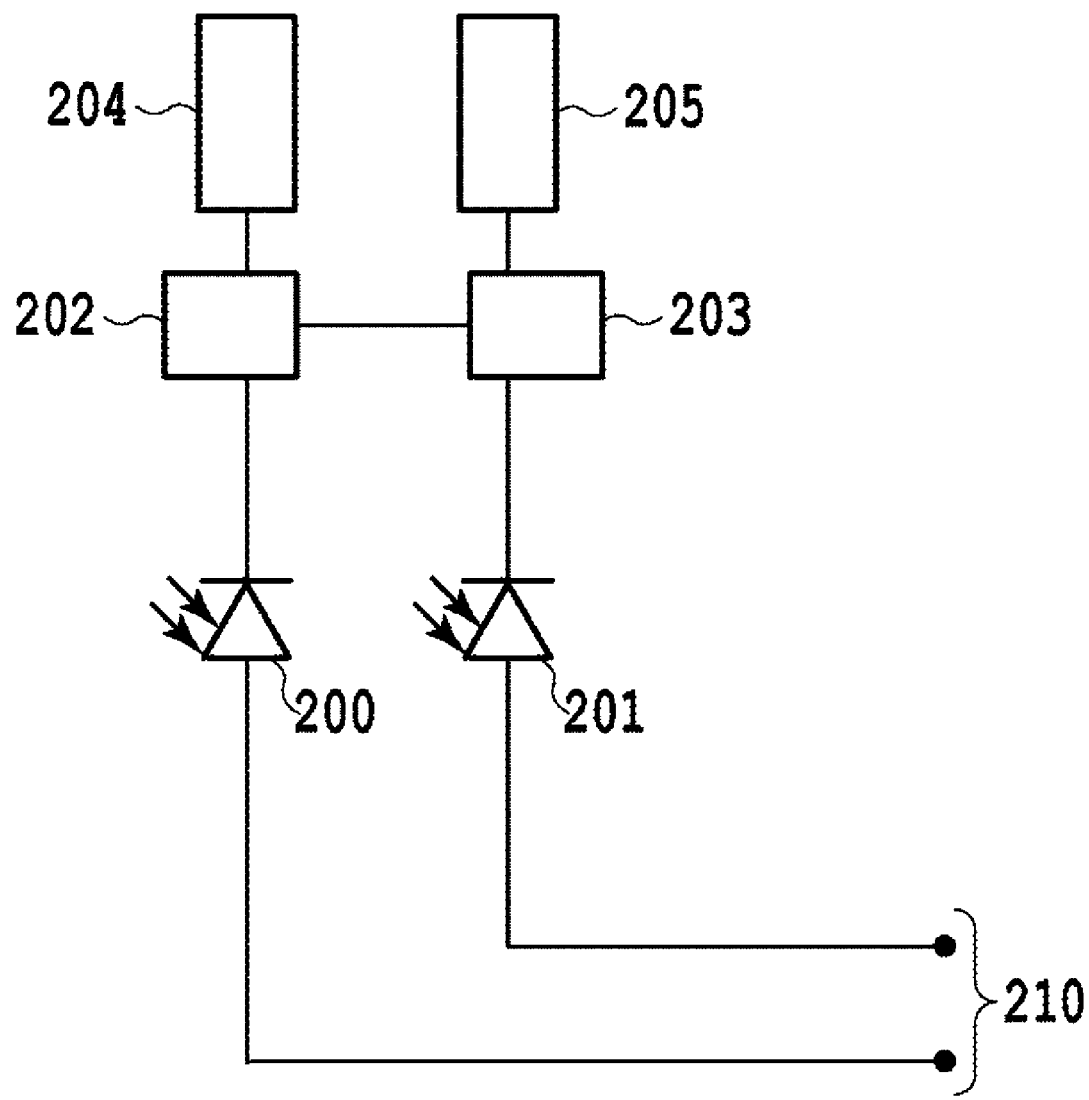
FIG. 8 is a diagram illustrating a photodetector according to an embodiment of the present invention.

FIG. 8 illustrates a photodetector according to an embodiment of the present invention. The photodetector includes a set of two GePDs 200 and 201 that receive differential signals, monitors 202 and 203 that detect photocurrents flowing through the GePDs, and power supplies 204 and 205 that apply a voltage to the GePDs. The monitors 202 and 203 exchange detected current values with each other. When the monitors 202 and 203 detect the photocurrent flowing through the GePDs 200 and 201, the power supplies 204 and 205 adjust the voltages applied to the GePDs 200 and 201 so that the current values of the monitors 202 and 203 are equal to each other.

Figure 9:
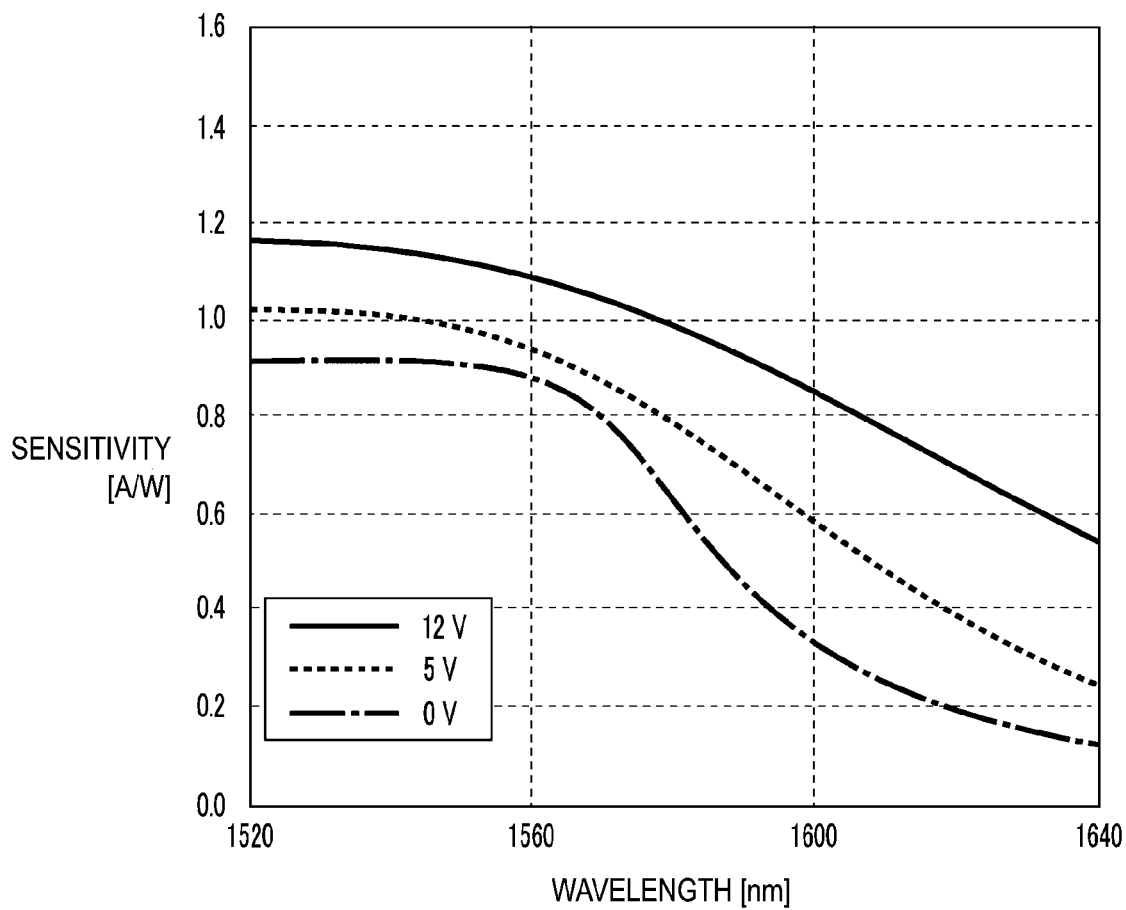
FIG. 9 is a diagram illustrating dependence of sensitivity of a GePD on an applied voltage.

FIG. 9 illustrates dependence of the sensitivity of a GePD on an applied voltage. When a voltage applied to the GePD is changed with respect to a wavelength used in C and L bands, the sensitivity changes as illustrated in FIG. 9. Therefore, when the applied voltages are adjusted so that the current values of the monitors 202 and 203 are equal to each other, the sensitivity of the two GePDs 200 and 201 can be made uniform. The currents measured by the monitors 202 and 203 are photocurrents, and when the current values match, it can be said that the sensitivity of the GePDs 200 and 201 completely match. Therefore, in the photodetector of the present embodiment, deterioration of a common-mode rejection ratio cannot occur.

Here, the monitor is connected to a cathode of the GePD, but the monitor may be connected to an anode connected to a signal output terminal 210.

Example 1

Figure 1:
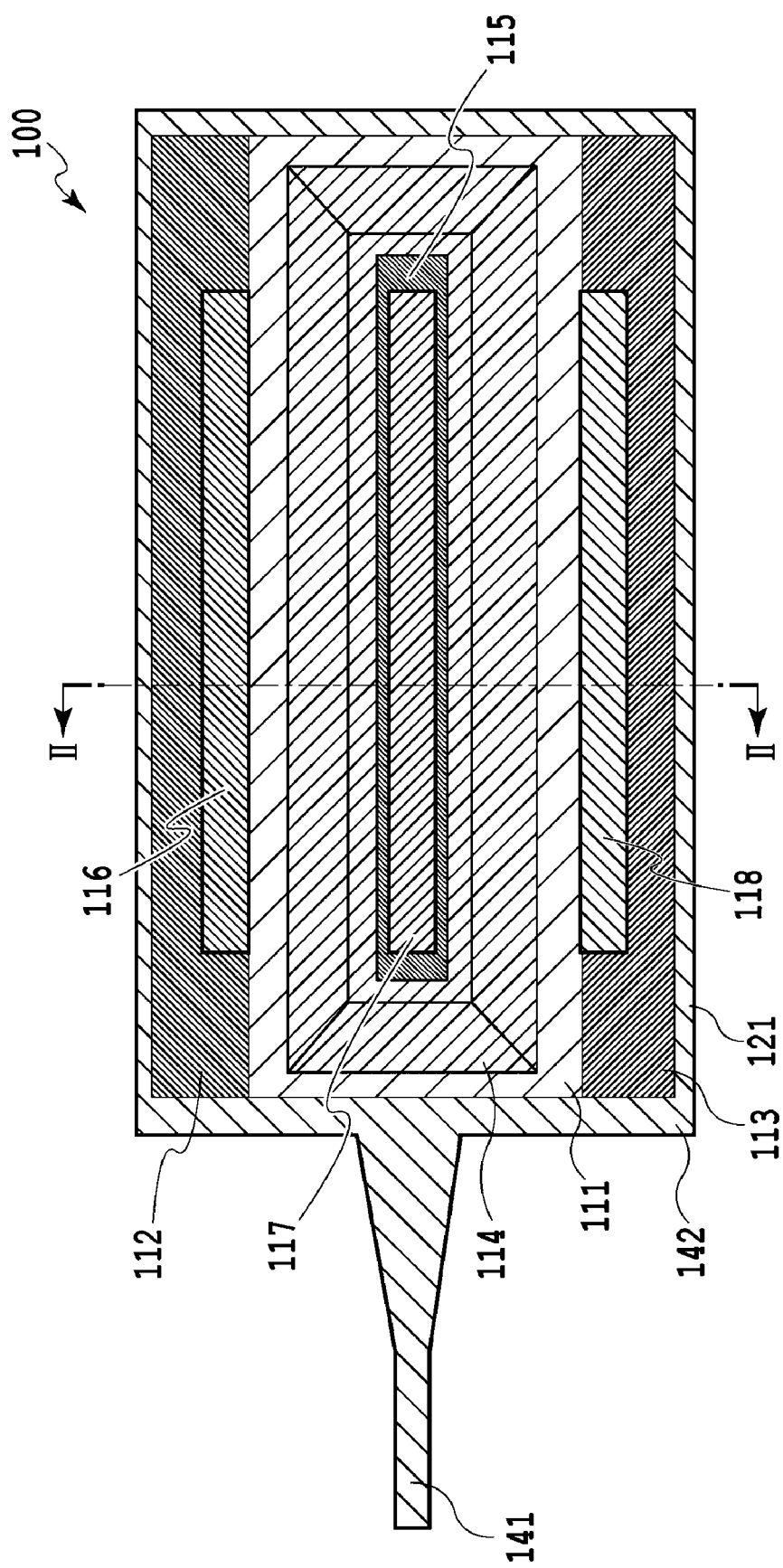
FIG. 1 is a diagram illustrating a structure of a waveguide-coupled vertical GePD of the related art.
Figure 2:
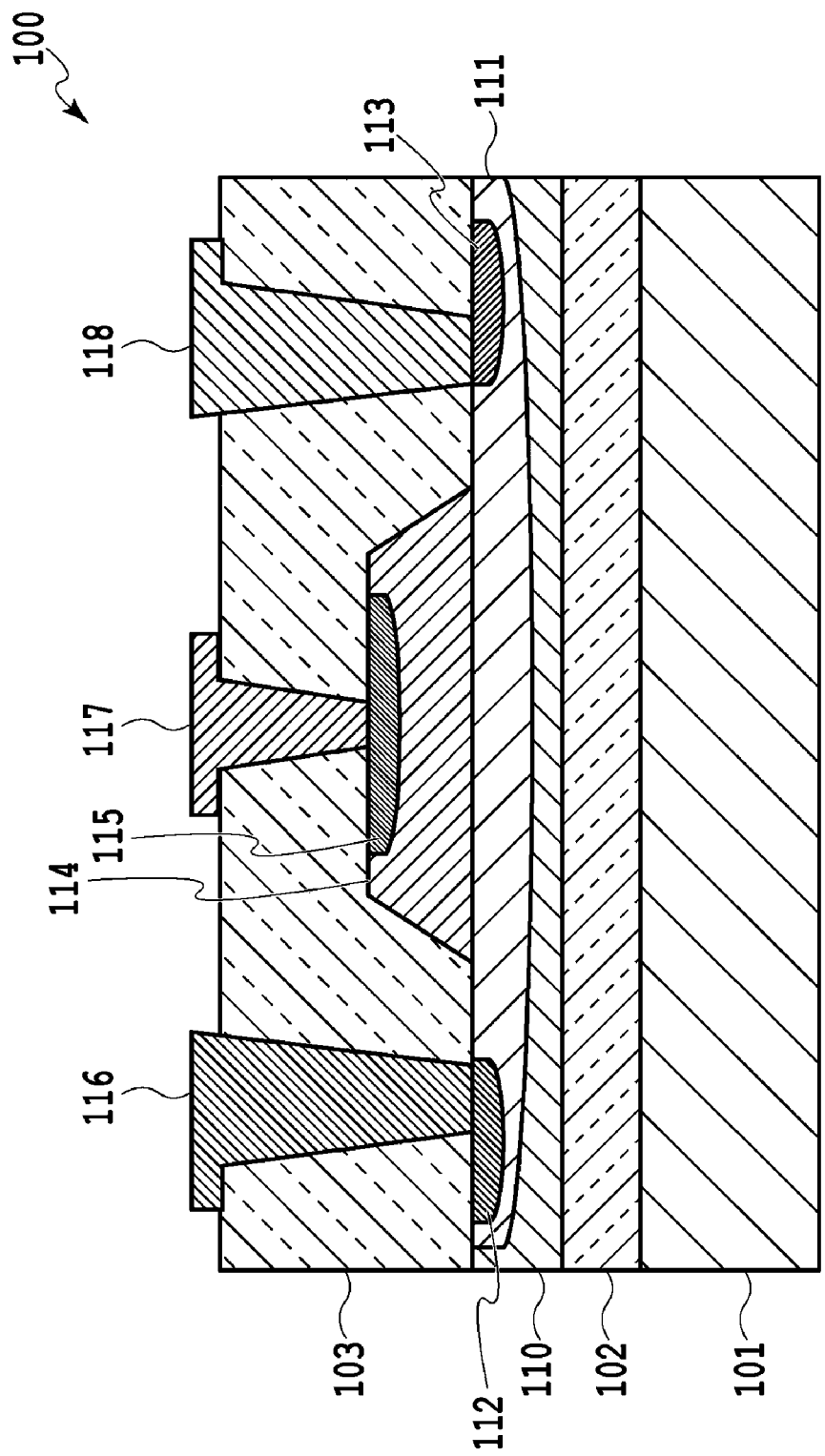
FIG. 2 is a cross-sectional view of the vertical GePD illustrated in FIG. 1.
Figure 3:
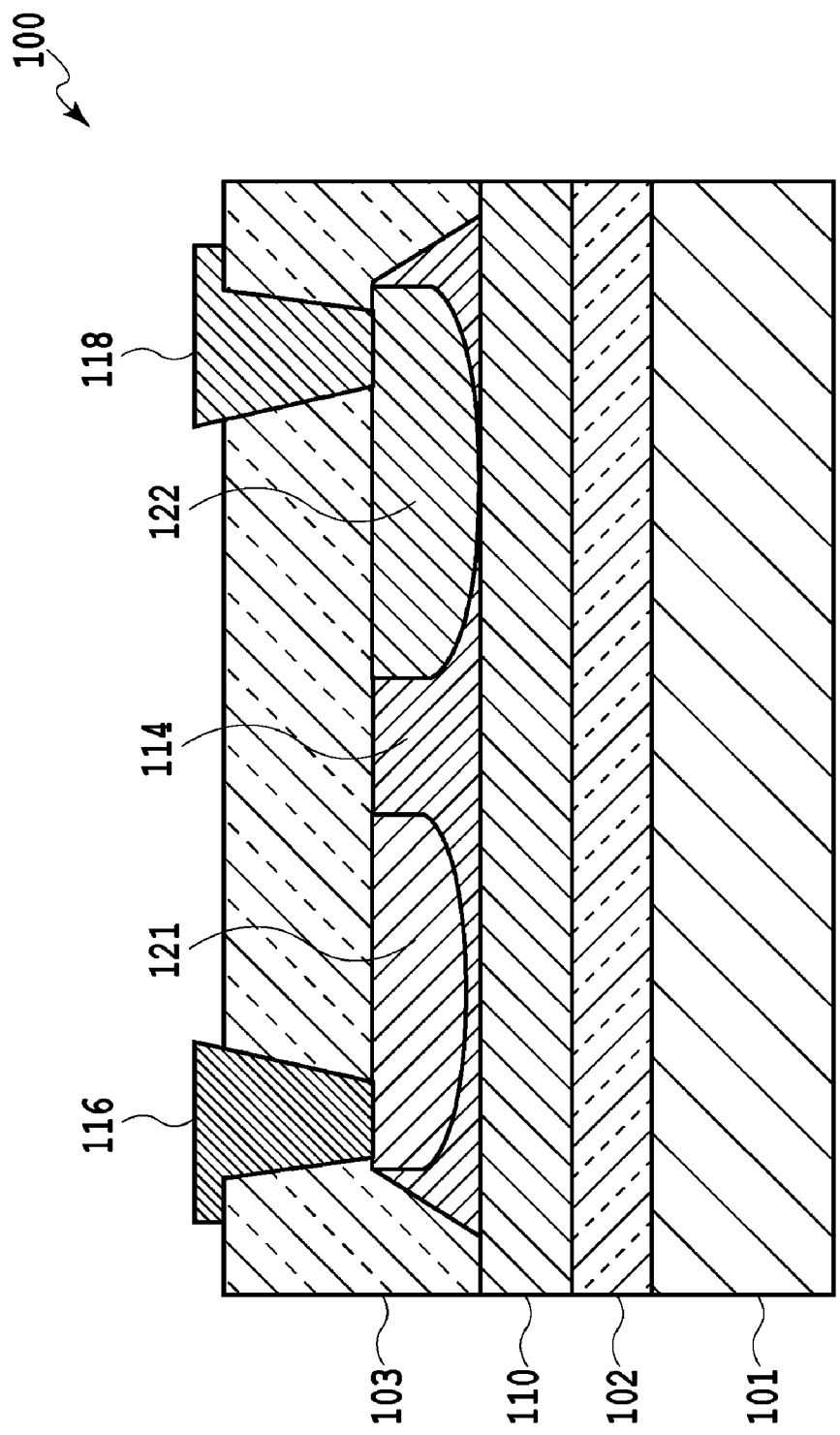
FIG. 3 is a diagram illustrating a first example of a waveguide-coupled horizontal GePD of the related art.
Figure 4:
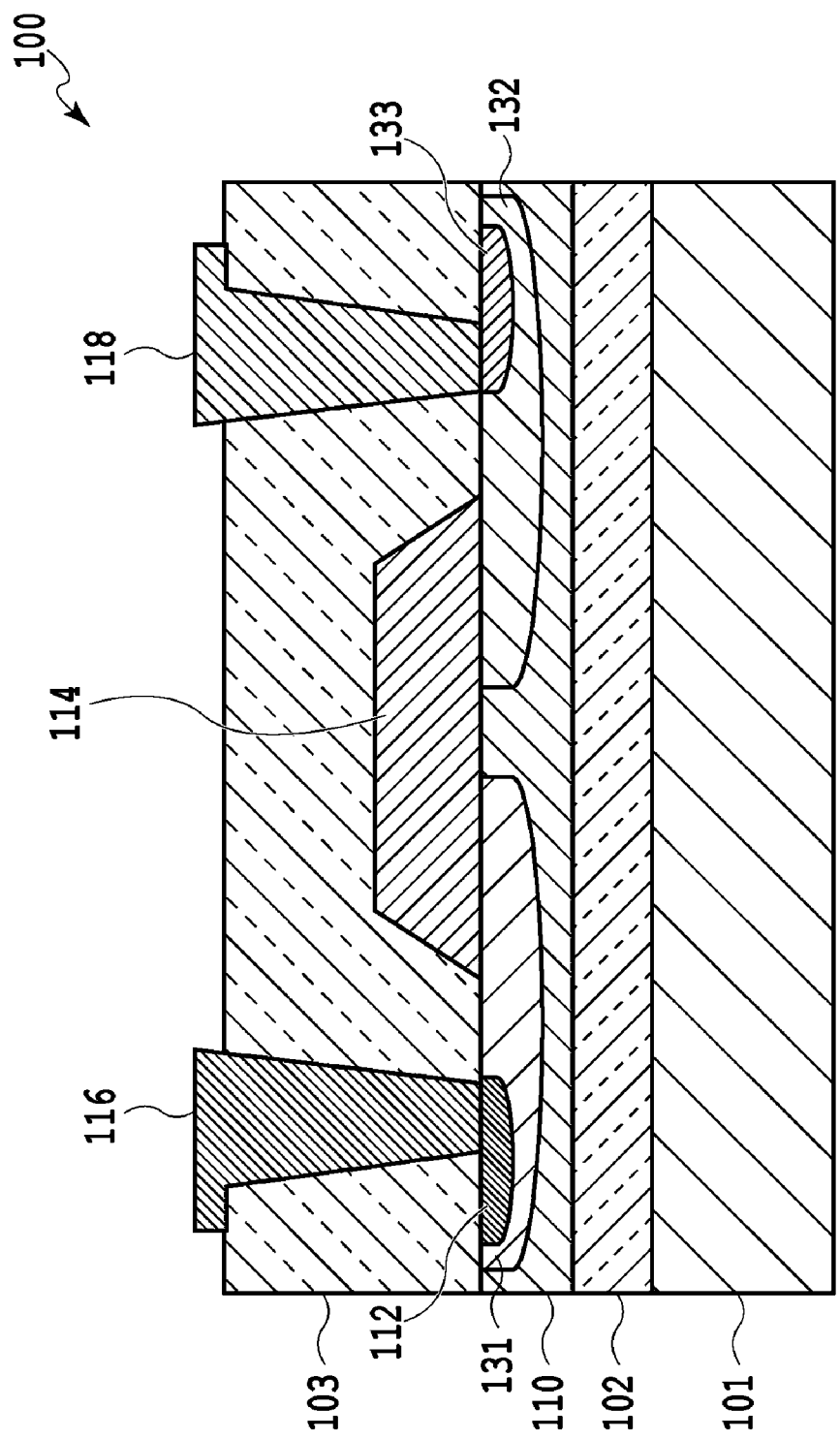
FIG. 4 is a diagram illustrating a second example of a waveguide-coupled horizontal GePD of the related art.
Figure 5:
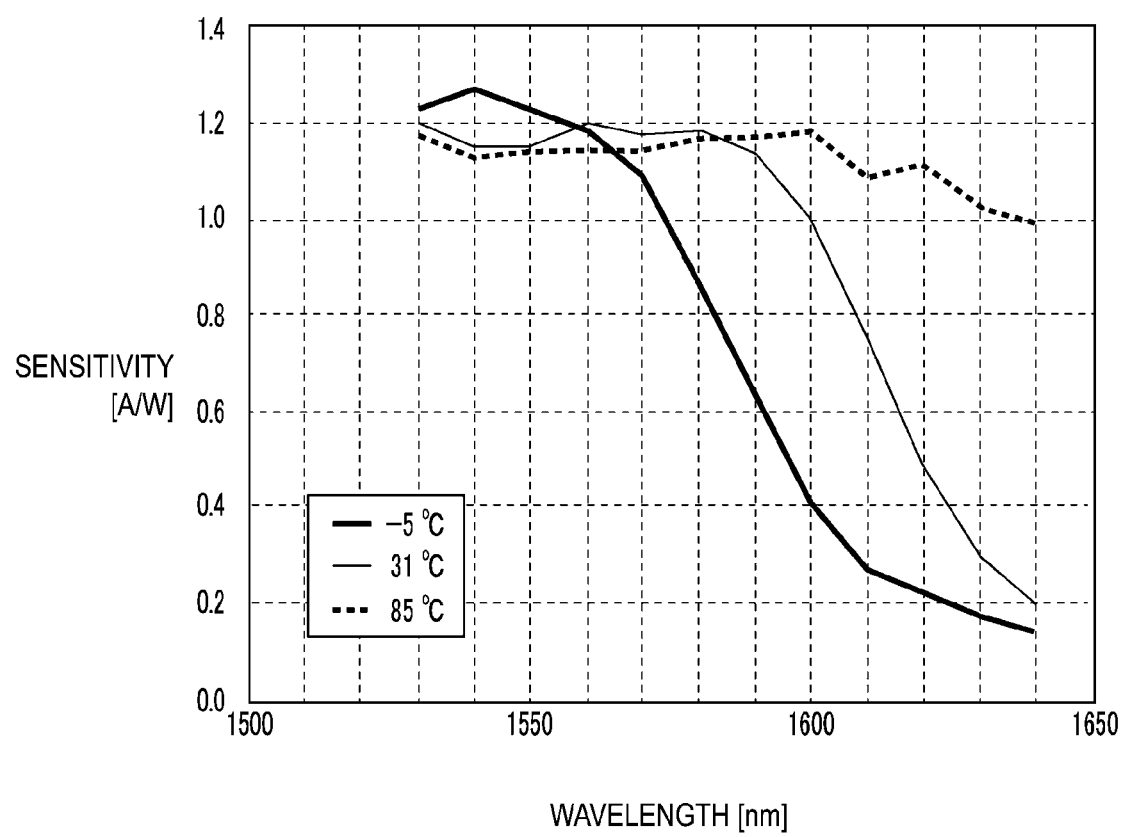
FIG. 5 is a diagram illustrating temperature and wavelength dependent characteristics of sensitivity of the GePD of the related art.
Figure 6:
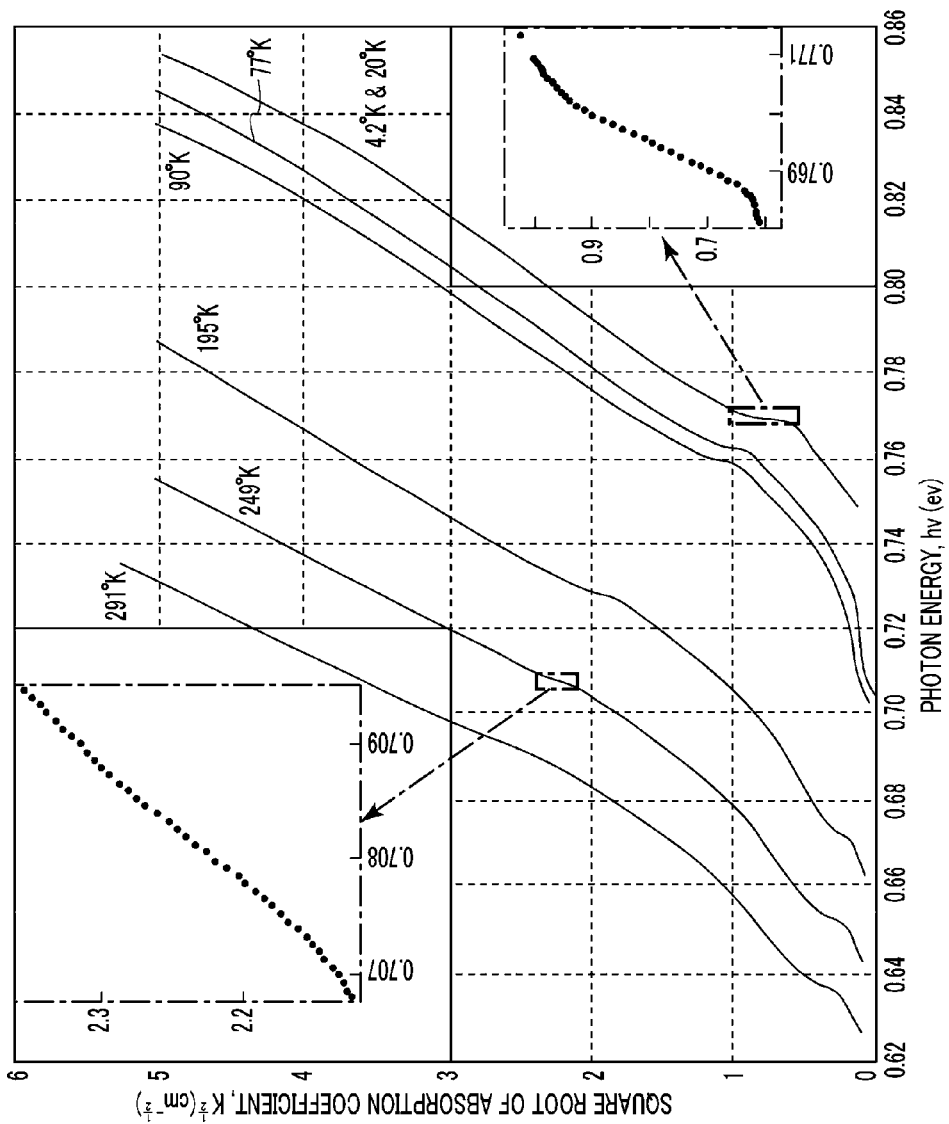
FIG. 6 is a diagram illustrating temperature dependent characteristics of a light absorption spectrum of Ge.
Figure 7:
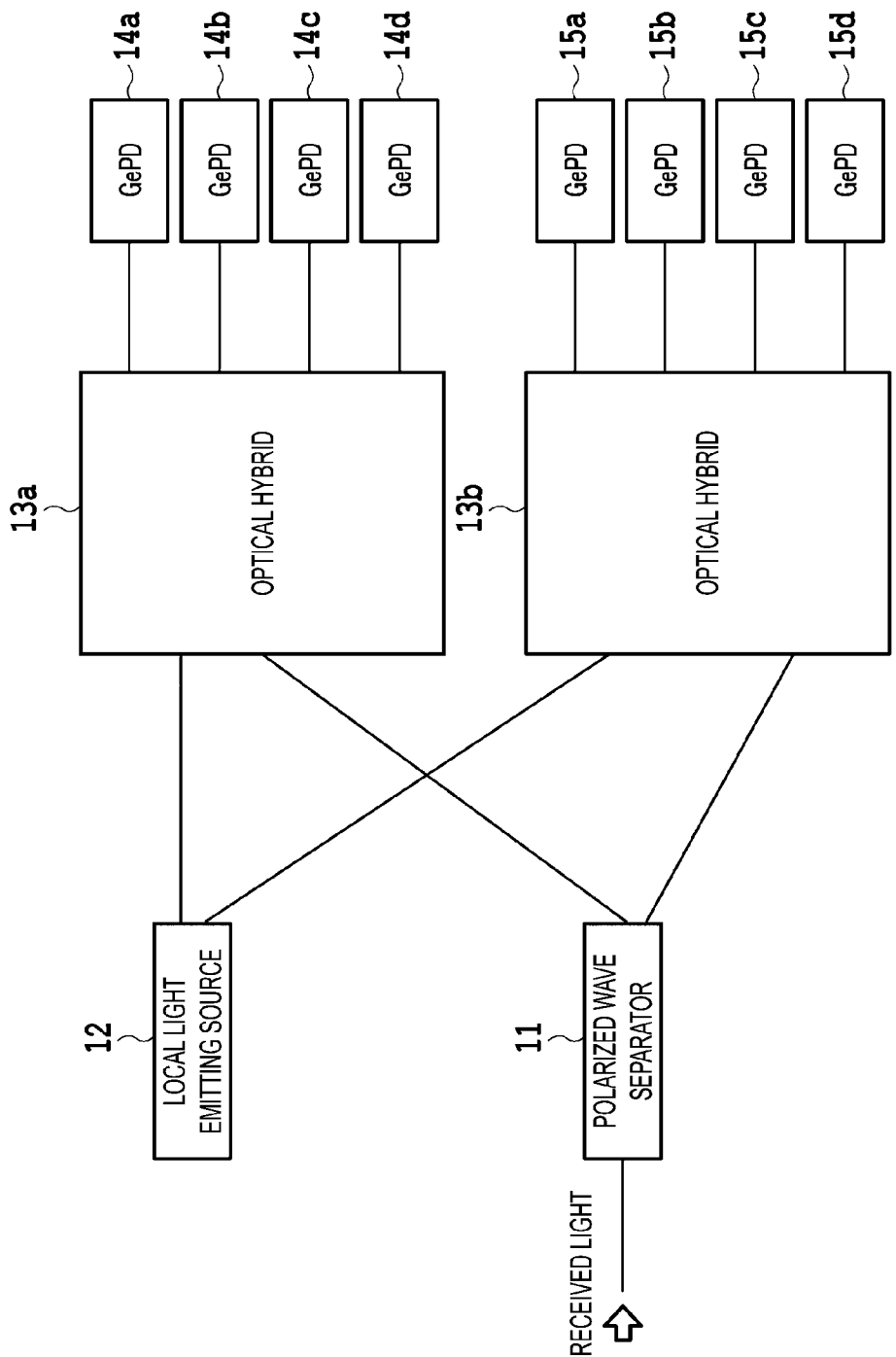
FIG. 7 is a diagram illustrating an example of a configuration of a receiver that is used in an optical digital coherent communication technology.
Figure 10:
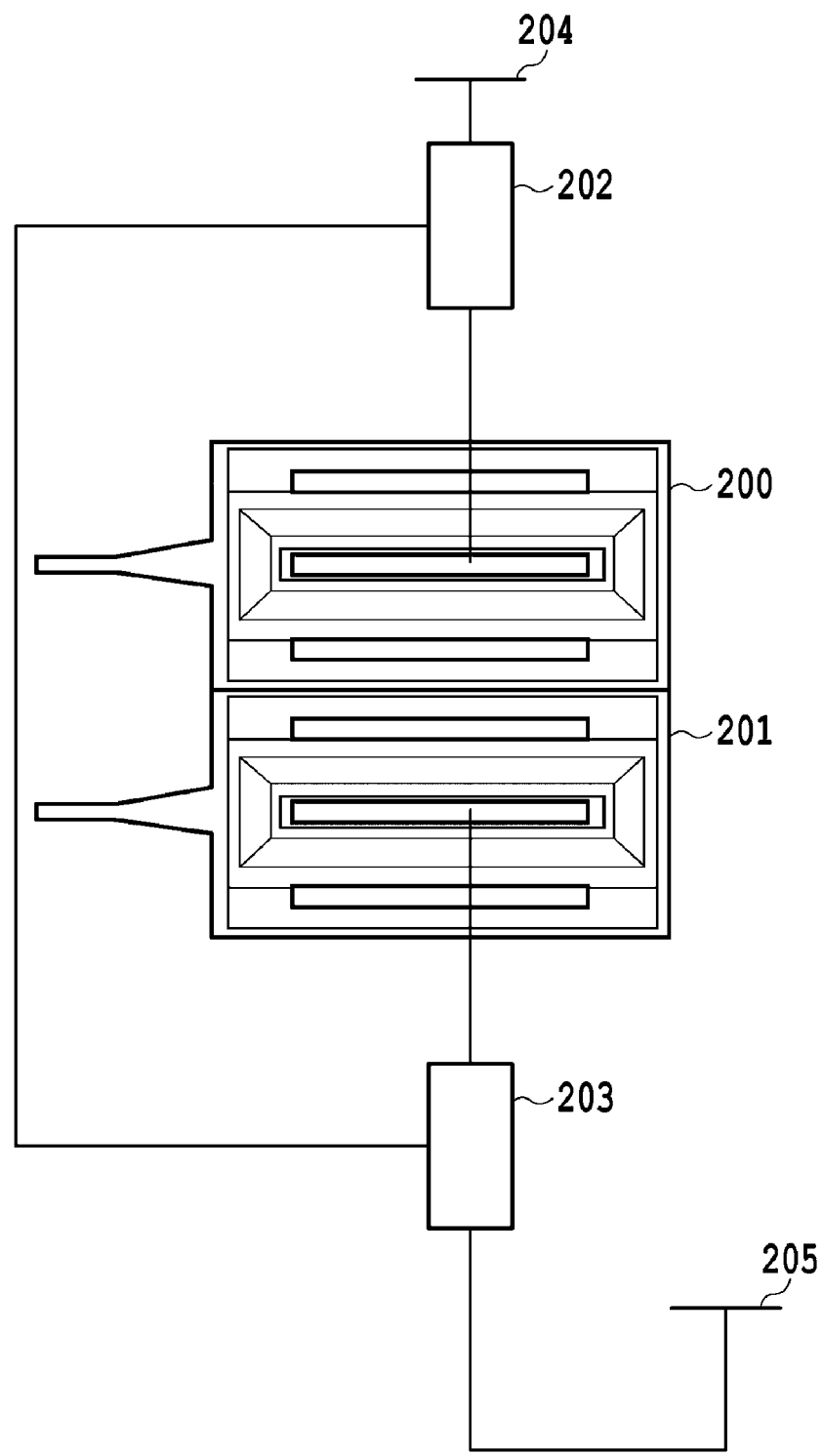
FIG. 10 is a diagram illustrating a photodetector according to Example 1 of the present invention.

FIG. 10 illustrates a photodetector according to Example 1 of the present invention. Ammeters are connected as the monitors 202 and 203 to the cathodes of the GePDs 200 and 201, that is, the cathode corresponding to the electrode 117 of the GePD 100 illustrated in FIG. 1, respectively. The GePDs 200 and 201 are arranged as a set of GePD pairs that receive the differential signals. The voltage supplies 204 and 205 are connected to the monitors 202 and 203.

The voltage supplies 204 and 205 adjust voltages applied to the cathodes of the GePDs so that the current values of the photocurrents measured by the monitors (ammeters) 202 and 203 are equal to each other. The monitors 202 and 203 may be connected to anodes of the GePDs 200 and 201, that is, anodes corresponding to the electrodes 116 and 118 of the GePD 100 illustrated in FIG. 1.

Example 2

Figure 11:
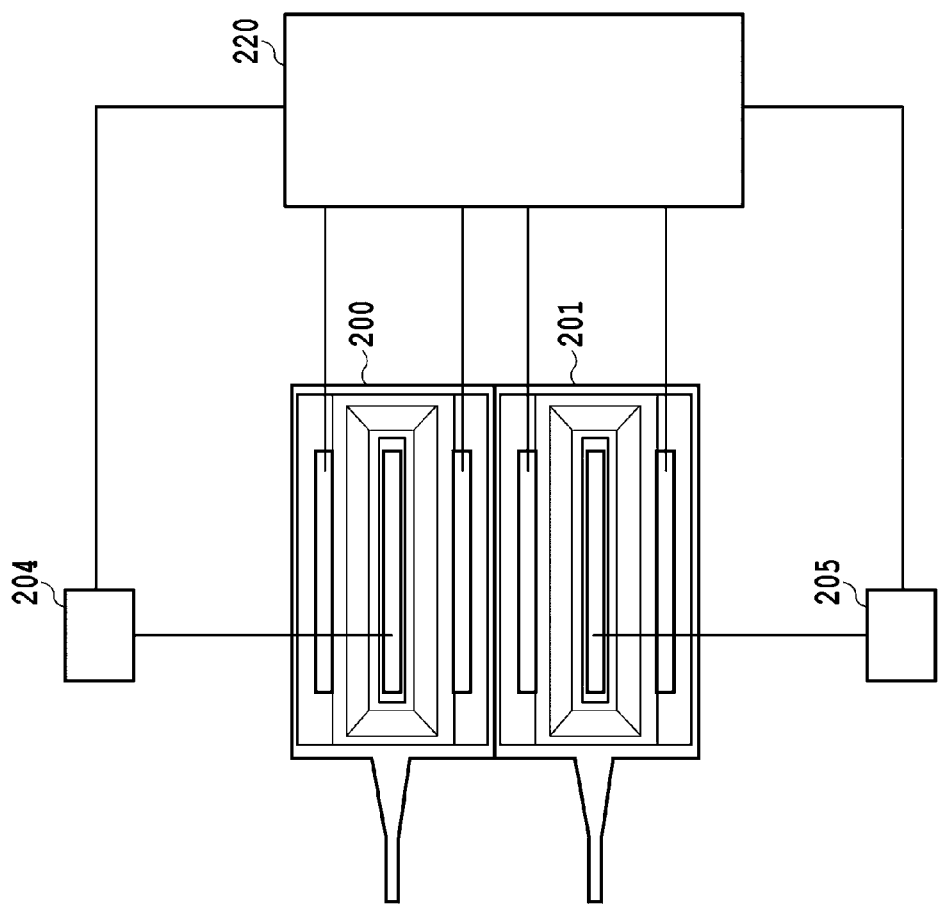
FIG. 11 is a diagram illustrating a photodetector according to Example 2 of the present invention.

FIG. 11 illustrates a photodetector according to Example 2 of the present invention. A transimpedance amplifier 220 is connected to the anodes of GePDs 200 and 201, that is, the anodes corresponding to the electrodes 116 and 118 of the GePD 100 illustrated in FIG. 1. The GePDs 200 and 201 are arranged as a set of GePD pairs that receive the differential signals.

The transimpedance amplifier 220 is an amplifier that converts a current signal of the GePD to a voltage signal, amplifies the voltage signal, and outputs the resultant voltage signal, and can monitor the photocurrent from the GePD. This current value is fed back to the voltage supplies 204 and 205. The voltage supplies 204 and 205 adjust voltages applied to the cathodes of the GePDs 200 and 201 so that currents input from the GePDs 200 and 201 to the transimpedance amplifier 220 are equal to each other. The transimpedance amplifier 220 may also be connected to the cathodes of the GePDs 200 and 201.

Example 3

Figure 12:
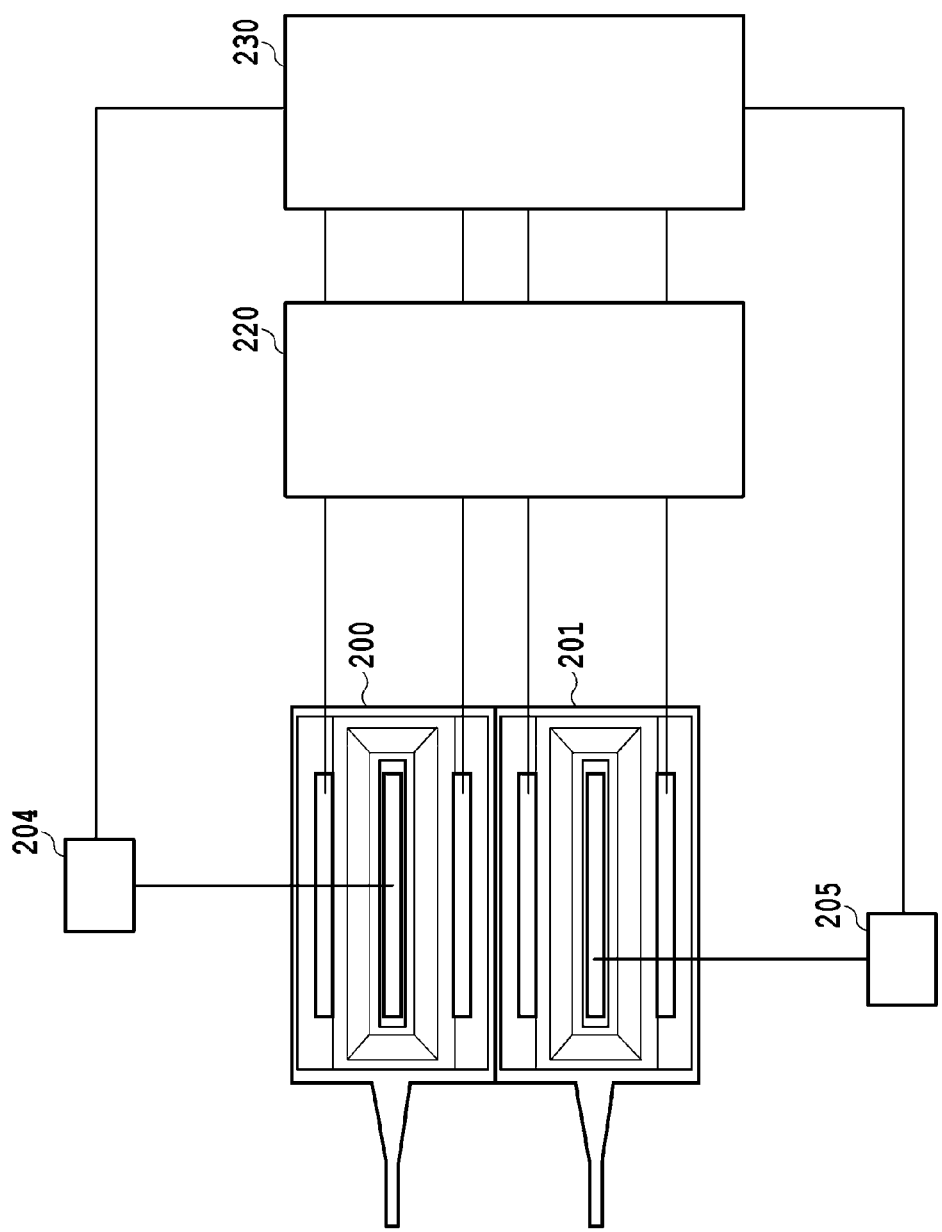
FIG. 12 is a diagram illustrating a photodetector according to Example 3 of the present invention.

FIG. 12 illustrates a photodetector according to Example 3 of the present invention. The transimpedance amplifier 220 is connected to the anodes of GePDs 200 and 201, that is, the anodes corresponding to the electrodes 116 and 118 of the GePD 100 illustrated in FIG. 1. A digital signal processor 230 is further connected to a stage posterior to the transimpedance amplifier 220. The GePDs 200 and 201 are arranged as a set of GePD pairs that receive the differential signals.

The digital signal processor 230 monitors signals input from the GePDs 200 and 201 via the transimpedance amplifier 220, and feeds back a monitoring value to the voltage supplies 204 and 205. The voltage supplies 204 and 205 adjust voltages applied to the cathodes of the GePDs 200 and 201 so that currents input from the GePDs 200 and 201 to the transimpedance amplifier 220 are equal to each other. The transimpedance amplifier 220 may also be connected to the cathodes of the GePDs 200 and 201.

REFERENCE SIGNS LIST 100, 200, 201 GePD
101 Si substrate
102 Lower clad layer
103 Upper clad layer
110 Core layer
111 P-type Si slab
112, 113, 133 Silicon electrode portion
114 Ge layer
115 Ge region
116 to 118 Electrode
121, 122 Germanium region
131, 132 Silicon region
141 Waveguide layer
142 Silicon slab
202, 203 Monitor
204, 205 Power supply
220 Transimpedance amplifier
230 Digital signal processor

The invention claimed is:

1. A photodetector comprising:
one or a plurality of sets of two photodiodes to which a differential signal is input;
a first monitor connected to a first one of the two photodiodes and a second monitor connected to a second one of the two photodiodes, the first and second monitors configured to measure a photocurrent of the photodiode connected to the respective first and second monitor, the first and second monitors being connected to each other so as to exchange detected photocurrent values with each other; and
a first voltage supply configured to control a voltage applied to the first one of the two photodiodes and a second voltage supply configured to control a voltage applied to the second one of the two photodiodes,
wherein the first and second voltage supplies control the voltage applied to the two photodiodes based on the detected photocurrent values exchanged by the first and second monitors so that the photocurrent value measured by the first monitor connected to the first on of the two photodiodes is equal to the photocurrent values measured by the second monitor connected to the second one of the two photodiodes.

2. The photodetector according to claim 1, wherein the photodiode includes
a silicon substrate;
a lower clad layer formed on the silicon substrate;
a core layer formed on the lower clad layer and including a silicon slab doped with impurity ions having a first conductivity type, an electrode portion doped with the impurity ions having the first conductivity type at a high concentration, and a waveguide layer connected to the silicon slab;
a germanium layer formed on the core layer and including a germanium region doped with impurities having a second conductivity type;
an upper clad layer formed on the core layer and the germanium layer; and
electrodes connected to the electrode portion and the germanium region, respectively.

3. The photodetector according to claim 1, wherein the photodiode includes
a silicon substrate;
a lower clad layer formed on the silicon substrate;
a core layer formed on the lower clad layer and including a silicon slab doped with impurity ions having a first conductivity type, and a waveguide layer connected to the silicon slab;
a germanium layer formed on the core layer and including a first germanium region doped with the impurity ions having the first conductivity type and a second germanium region doped with impurity ions having a second conductivity type;
an upper clad layer formed on the core layer and the germanium layer; and
electrodes connected to the first germanium region and the second germanium region, respectively.

4. The photodetector according to claim 1, wherein the photodiode includes
a silicon substrate;
a lower clad layer formed on the silicon substrate;
a core layer formed on the lower clad layer and including a silicon slab, the silicon slab including a first silicon region doped with impurity ions having a first conductivity type, a first electrode portion doped with the impurity ions having the first conductivity type, a second silicon region doped with impurity ions having a second conductivity type, and a second electrode portion doped with the impurity ions having the second conductivity type, and a waveguide layer connected to the silicon slab;

a germanium layer formed on the core layer;

an upper clad layer formed on the core layer and the germanium layer; and electrodes connected to the first electrode portion and the second electrode portion.

5. The photodetector according to claim 1, wherein the first and second monitors are an ammeter connected to an anode or a cathode of each of the two photodiodes.

6. The photodetector according to claim 1, wherein the first and second monitors are a transimpedance amplifier connected to an anode or a cathode of each of the two photodiodes.

7. The photodetector according to claim 6, wherein the first and second monitors are a digital signal processor connected to the transimpedance amplifier.

* * * * *